(12) United States Patent
Zwieback et al.

(10) Patent No.: US 8,313,720 B2
(45) Date of Patent: Nov. 20, 2012

(54) GUIDED DIAMETER SIC SUBLIMATION GROWTH WITH MULTI-LAYER GROWTH GUIDE

(75) Inventors: Ilya Zwieback, Washington Township, NJ (US); Avinash K. Gupta, Basking Ridge, NJ (US); Edward Semenas, Allentown, PA (US); Thomas E. Anderson, Convent Station, NJ (US)

(73) Assignee: II-VI Incorporated, Saxonburg, PA (US)

( * ) Notice: Subject to any disclaimer, the term of this patent is extended or adjusted under 35 U.S.C. 154(b) by 416 days.

(21) Appl. No.: 12/522,549

(22) PCT Filed: Jan. 15, 2008

(86) PCT No.: PCT/US2008/051071
§ 371 (c)(1), (2), (4) Date: Nov. 10, 2009

(87) PCT Pub. No.: WO2008/089181
PCT Pub. Date: Jul. 24, 2008

(65) Prior Publication Data
US 2010/0061914 A1    Mar. 11, 2010

Related U.S. Application Data

(60) Provisional application No. 60/880,590, filed on Jan. 16, 2007.

(51) Int. Cl.
*C01B 31/36* (2006.01)

(52) U.S. Cl. .............................. 423/345; 117/23; 117/81

(58) Field of Classification Search ................... 423/345; 117/23, 81
See application file for complete search history.

(56) References Cited

U.S. PATENT DOCUMENTS
5,611,955 A    3/1997    Barrett et al.
5,667,587 A    9/1997    Glass et al.
(Continued)

FOREIGN PATENT DOCUMENTS
WO    0163020 A1    8/2001

OTHER PUBLICATIONS

Bahng, W. et. al., "Rapid enlargement of SiC single crystal using a cone-shaped platform," Journal of Crystal Growth, 2000, pp. 767-772, vol. 209, No. 4.

(Continued)

*Primary Examiner* — Stuart Hendrickson
(74) *Attorney, Agent, or Firm* — The Webb Law Firm

(57) ABSTRACT

In the growth of a SiC boule, a growth guide is provided inside of a growth crucible that is charged with SiC source material at a bottom of the crucible and a SiC seed crystal at a top of the crucible. The growth guide has an inner layer that defines at least part of an opening in the growth guide and an outer layer that supports the inner layer in the crucible. The opening faces the source material with the seed crystal positioned at an end of the opening opposite the source material. The inner layer is formed from a first material having a higher thermal conductivity than the second, different material forming the outer layer. The source material is sublimation grown on the seed crystal in the growth crucible via the opening in the growth guide to thereby form the SiC boule on the seed crystal.

12 Claims, 10 Drawing Sheets

U.S. PATENT DOCUMENTS

| | | |
|---|---|---|
| 5,683,507 A | 11/1997 | Barrett et al. |
| 5,746,827 A | 5/1998 | Barrett et al. |
| 5,968,261 A | 10/1999 | Barrett et al. |
| 5,985,024 A | 11/1999 | Balakrishna et al. |
| 6,428,621 B1 | 8/2002 | Vodakov et al. |
| 6,508,880 B2 | 1/2003 | Vodakov et al. |
| 6,534,026 B2 | 3/2003 | Vodakov et al. |
| 6,670,282 B2 | 12/2003 | Kuriyama et al. |
| 6,786,969 B2 | 9/2004 | Kondo et al. |
| 6,863,728 B2 | 3/2005 | Vodakov et al. |
| 6,890,600 B2 | 5/2005 | Nakamura et al. |
| 2003/0070611 A1 | 4/2003 | Nakamura et al. |

OTHER PUBLICATIONS

Matukov et. al., "Faceted Growth of SiC Bulk Crystals," Material Science Forum, 2004, pp. 63-66.

Nakamura, D. et. al., "Ultrahigh-Quality Silicon Carbide Single Crystals," Nature, 2004, pp. 1009-1012.

Nishizawa et al., "Effect of heat transfer on macroscopic and microscopic crystal quality in silicon carbide sublimation growth," Journal of Crystal Growth, 2007, pp. 342-344, vol. 303, No. 1.

Tairov, Y. et. al., "Investigation of Growth Processes of Ingots of Silicon Carbide Single Crystals," Journal of Crystal Growth, 1978, pp. 209-212, vol. 43.

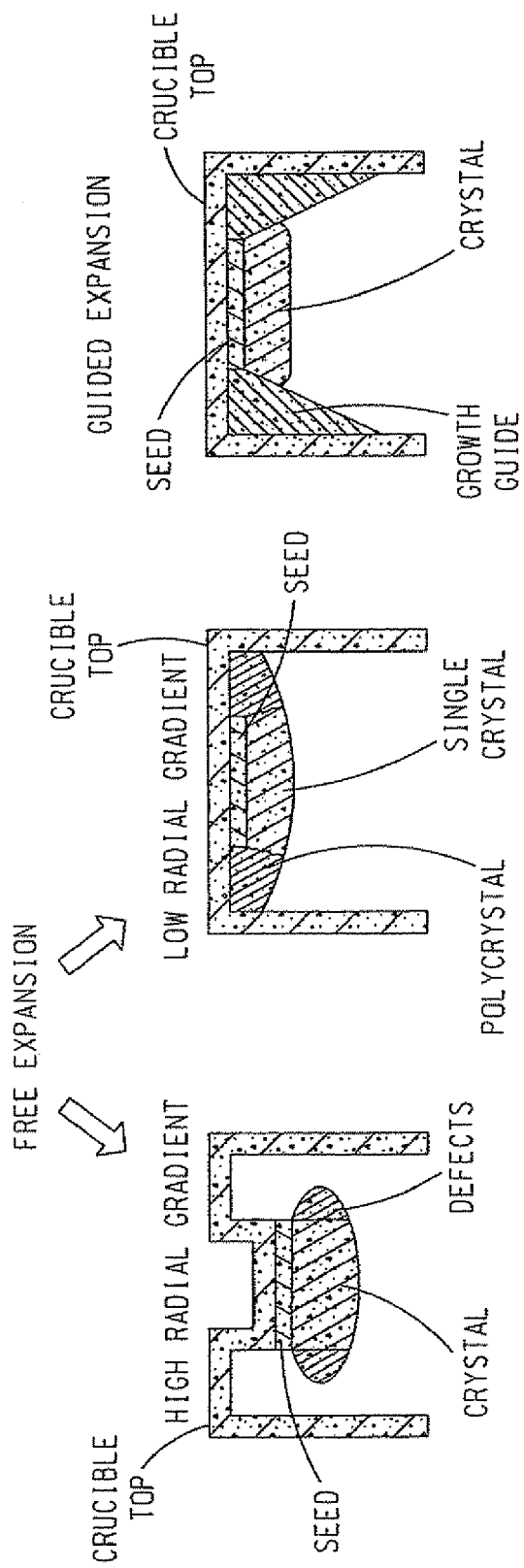

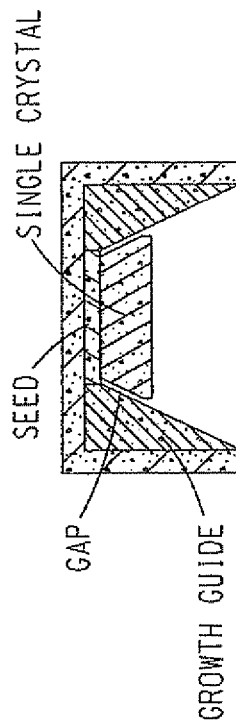
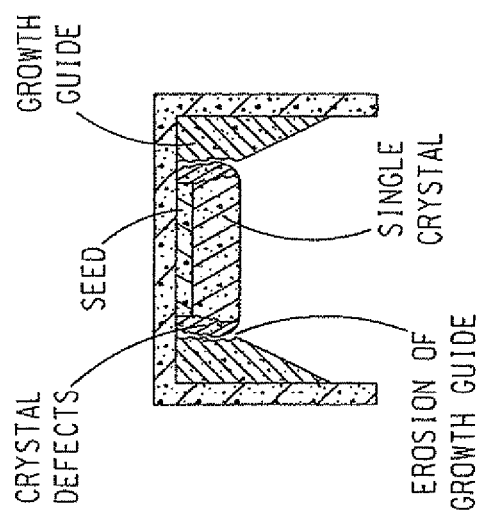
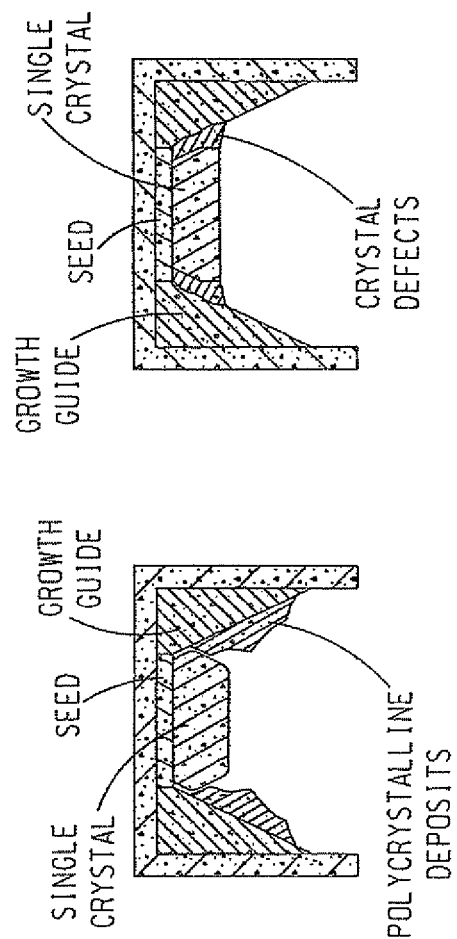
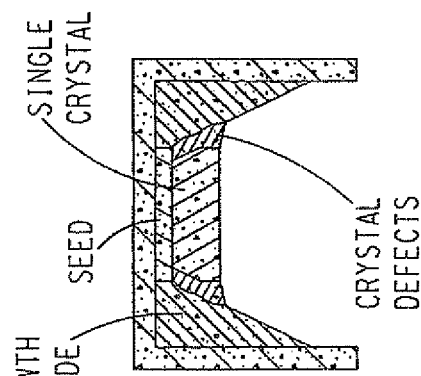
FIG. 4A (PRIOR ART)
FIG. 4B (PRIOR ART)
FIG. 4C (PRIOR ART)
FIG. 4D (PRIOR ART)

AVERAGE DD = $1.2 \cdot 10^5 \text{ cm}^2$
FRAME AREA = $5 \cdot 10^{-3} \text{ cm}^2$ AVERAGE DD = $4.6 \cdot 10^5 \text{ cm}^{-2}$
FRAME AREA = $5 \cdot 10^{-3} \text{ cm}^2$

GUIDED DIAMETER SIC SUBLIMATION GROWTH WITH MULTI-LAYER GROWTH GUIDE

BACKGROUND OF THE INVENTION

Wafers of silicon carbide of 4H and 6H polytypes serve as lattice-matched substrates to grow epitaxial layers of SiC and GaN which are used for fabrication of SiC- and GaN-based semiconductor devices. The performance of such semiconductor devices is strongly affected by crystalline defects in the substrate and epilayer. Among the most unwanted defects in the SiC substrate are micropipes, dislocations and low-angle grain boundaries. It is generally recognized that high defect densities in SiC and GaN single crystals adversely affect the performance of devices made from these single crystals.

With reference to FIG. 1, large SiC single crystals are commonly grown by a sublimation technique called Physical Vapor Transport (PVT). A typical PVT growth system includes a crucible 1, typically made of graphite, loaded with polycrystalline SiC source material 3 and a SiC seed crystal 4, typically, a SiC single crystal. Source 3 is disposed at the bottom of the crucible 1 while seed 4 is affixed to a crucible lid or top 2. Crucible 1 is surrounded by thermal insulation 6. An RF coil 7 couples electromagnetically with crucible 1 heating it to SiC growth temperatures, generally between 1900° C. and 2400° C. Also or alternatively, a resistance heater (not shown) can be utilized for heating the interior of crucible 1 to SiC growth temperatures. RF coil 7 is positioned with respect to crucible 1 in such a fashion that the temperature of source 3 is higher than the temperature of seed 4, with the temperature difference being between several and 200° C. Source 3 and seed 4 temperatures are typically monitored using optical pyrometers via openings 8 made in thermal insulation 6.

At high temperatures, source 3 vaporizes and fills crucible 1 with volatile molecules of $Si_2C$, $SiC_2$ and Si. Driven by the temperature gradient inside crucible 1, the vapors move and condense on seed 4 forming a single crystal 5.

Prior art methods and apparatus for PVT growth are disclosed in the following documents: Y. Tairov and V. Tsvetkov, "Investigation of Growth Processes of Ingots of Silicon Carbide Single Crystals", J. Crystal Growth, Vol. 43 (1978), pp. 209-212; D. Nakamura et al., "Ultrahigh-Quality Silicon Carbide Single Crystals", Nature 430, pp. 1009-1012, 2004; D. Nakamura et al., "SiC Single Crystal, Method for Manufacturing SiC Single Crystal, SiC Wafer Having an Epitaxial Film, Method for Manufacturing SiC Wafer Having an Epitaxial Film, and SiC Electronic Device"; I. D. Matukov et al., "Faceted Growth of SiC Bulk Crystals", Mat. Sci. Forum 457-460 (2004), pp. 63-66; and U.S. Pat. Nos. 5,683,507; 5,611,955; 5,667,587; 5,746,827; 5,968,261; 5,985,024; 6,428,621; 6,508,880; 6,534,026; 6,863,728; 6,670,282; 6,786,969; and 6,890,600.

Dimensional defects in hexagonal 4H and 6H SiC crystals, such as single crystal 5, can be divided into two categories: "Threading" and "Basal Plane". Threading dislocations are those with the dislocation line parallel to the hexagonal c-axis. Examples of threading defects include Threading Edge Dislocations (TED), Threading Screw Dislocations (TSD) and micropipes. Basal Plane Dislocations (BPD) and basal plane stacking faults are those laying parallel to the basal c-plane.

When a SiC crystal is grown in the c-direction (also known as "on-axis" or "normal" growth), TEDs, TSDs and micropipes present in the seed crystal replicate and propagate into the growing crystal, while basal plane defects do not. When a SiC crystal is grown in the direction perpendicular to the c-axis (also known as "lateral" growth that can be carried out in the a, m or other crystallographic directions perpendicular to the hexagonal c-axis), the situation is opposite: basal plane defects (BPDs and stacking faults) replicate and propagate into the growing crystal, while threading defects do not. Therefore, repetition of lateral and normal growth can lead to reduced defect densities and improved crystal quality.

In one prior art growth technique, lateral and normal crystal growth is carried out separately, each time requiring a new seed, new source, new crucible, etc. However, this technique is too complex and lengthy to be used as an industrial process.

With reference to FIG. 2, a sequence of lateral and normal growth takes place when the growing crystal expands laterally beyond the seed size. A SiC seed 10, like SiC seed 4 in FIG. 1, with its faces cut parallel to the crystallographic c-plane contains threading defects (dislocations, micropipes) shown as dotted lines in FIG. 2, which also depicts three sequential time intervals of crystal growth designated as Step 1, Step 2 and Step 3. In Step 1, the crystal grows normally from seed 10 forming a crystal layer 11. Layer 11 inherits all threading defects from seed 10, but contains no basal plane defects. Simultaneously with the growth of layer 11, volume 12 is formed. Volume 12 grows laterally from layer 11 and, therefore, is free of threading defects. However, it is also free of basal plane defects because layer 11, which serves as a seed for volume 12, does not contain them.

In Step 2, a layer 13 grows in a direction normal from layer 11, inheriting all threading defects. Simultaneously, volumes 14 and 15 are formed. Volume 14 grows in a direction normal from volume 12, while volume 15 grows laterally. Both volumes 14 and 15 contain neither threading nor basal plane defects.

In Step 3, volumes 16, 17 and 18 are formed. As can be seen, volume 16 contains threading defects, while volumes 17 and 18 contain neither threading nor basal plane defects.

As can be seen, the SiC boule portion that expanded laterally beyond the limits of seed 10 includes volumes 12, 14, 15, 17 and 18 that ideally contain neither threading nor basal plane defects.

Two possible modes of crystal diameter expansion, free and guided, are shown schematically in FIGS. 3A and 3B, and 3C, respectively. FIGS. 3A-3C each show an isolated view of the upper portion of a growth crucible (like the growth crucible shown in FIG. 1) with a SiC seed crystal attached to the crucible lid or top. With particular reference to FIGS. 3A and 3B, in free expansion, the single crystal does not touch the crucible walls or any other interior parts of the crucible (except the crucible top) and its shape and morphology are determined only by temperature gradients in the crucible. In the case when the radial temperature gradients are strong, the crystal develops a shape of a lens with multiplicity of edge facets, as shown in FIG. 3A. This type of expansion leads to a high degree of thermo-elastic stress and generation of dislocations, especially near the edge of the crystal boule. When the radial temperature gradients are low, polycrystalline SiC nucleates on the crucible lid around the seed and grows side-by-side with the single crystal, as shown in FIG. 3B, thus making the degree of single crystal expansion unpredictable.

A schematic diagram of so-called guided expansion of SiC boule diameter is shown in FIG. 3C. The distinctive feature of this technique is the cone-shaped growth guide which surrounds the seed and which forces the crystal to attain the shape of the guide's inner cavity in a process known as guided diameter expansion.

With reference to FIGS. 4A-4D, an ideal case of guided diameter expansion shown in FIG. 4A occurs when a SiC crystal, during growth, "glides" along the inner surface of the guide without coming in contact with it. A small gap, usually 1-2 mm wide or less, exists between the crystal and the growth guide.

However, the technique of guided expansion, is not problem free. The most harmful problems are illustrated in FIGS. 4B, 4C and 4D. FIG. 4B depicts erosion of the growth guide caused by the aggressive silicon-rich vapor(s) produced in the crucible during PVT growth. As a result of erosion, the inner surface of the growth guide becomes irregular, and so does the shape of the grown single crystal. The zone of irregular growth near the edge of the grown single crystal is populated with numerous defects.

Another problem is the formation of polycrystalline SiC deposits on the growth guide, as shown in FIG. 4C. These deposits consume nutrients from the vapor phase, thus reducing the size of the growing single crystal.

A merger between the crystal and the growth guide is illustrated in FIG. 4D. In the process of growth, the single crystal comes in contact with the guide, attaches to it and develops crude defects at the edge.

It is believed that in order to eliminate the merger of the single crystal with the growth guide as well as deposition of polycrystalline SiC on the growth guide, the inner surface of the growth guide should be maintained at a temperature higher than that of the growing crystal. This can be achieved by tailoring the geometry of the heater or coil, such as RF coil 7 in FIG. 1, and/or by using a growth crucible of a special (and complex) geometry.

PVT growth is a "closed" process, and the temperature inside the crucible cannot be measured experimentally—it can be assessed only by modeling. At high temperatures, thermal properties of graphite and SiC crystal are known only approximately. This makes the accuracy of thermal modeling low. In addition, thermal conditions in the crucible change during growth.

Erosion of the growth guide is caused by chemical attack of the guide material (usually graphite) by the aggressive silicon-rich vapor(s) produced in the crucible during PVT growth. Typically, crucibles, heat shields and other parts used in SiC sublimation growth are made of high-purity isostatically molded graphite. It is well-known that the chemical resistance of high-purity graphite depends on its structure. Generally, graphite is prepared by mixing graphitic filler (coke) with binder. Graphitic coke is comprised of small-size graphite grains ranging from tens to hundreds of microns in dimensions. The binder is comprised of an oil residue (pitch, tar) or of a high-carbon resin. The prepared mixture undergoes carbonization and graphitization, the latter at temperatures up to 3000° C. The final structure after graphitization is comprised of graphite grains surrounded by the graphitized binder. The graphitized binder is still somewhat amorphous, i.e., it contains disordered chemical bonds. In the process of chemical attack, the graphitized binder erodes (is removed) first. Removal of the graphitized binder liberates microscopic graphite grains, which may become airborne and contaminate the growing SiC crystal. This makes graphite with high binder content more prone to gas/vapor erosion than graphite with low binder content.

In order to protect graphite against gas/vapor erosion, various carbon and refractory coatings have been suggested. Carbon coatings may be comprised of amorphous (glassy, vitreous) carbon or pyrolytic crystalline graphite. These carbon coatings are thin, typically not more than 40-50 microns in thickness, and, in the conditions of SiC sublimation growth, they are quickly eroded by the vapor. The protective refractory coatings may include tantalum carbide or niobium carbide. However, in the conditions of SiC sublimation growth, these refractory coatings are not inert. Rather, they react with the vapor, peel off and lead to crystal contamination.

SUMMARY OF THE INVENTION

A growth guide made of carbon/graphite materials is comprised of an inner layer or sleeve and an outer layer. The inner layer, which faces the growing crystal, is made of high thermal conductivity graphite, while the outer layer is made of a porous carbon material having low thermal conductivity. This combination affects heat transport in the cavity of the guide and makes the temperature on its inner surface higher than that of the growing crystal. As a result, deposition of polycrystalline SiC and attachment of the growing crystal to the guide are avoided or eliminated.

The growth guide has improved resistance against vapor erosion, which is achieved by fabricating the inner layer of the guide from graphite with low binder content. Stability of the growth guide against erosion is additionally improved by removal of excessive silicon from the vapor. The removal is accomplished by including a silicon "getter" inside the growth crucible. The getter is desirably a carbon material with high chemical affinity for silicon.

More specifically, a SiC crystal boule growth method is disclosed that includes providing a growth guide inside of a growth crucible that is charged with SiC source material at a bottom of the crucible and a SiC seed crystal at a top of the crucible. The growth guide has an inner layer that defines at least part of an opening in the growth guide and an outer layer supporting the inner layer in the crucible. The opening faces the source material with the seed crystal positioned at an end of the opening opposite the source material. The inner layer is formed from a first material having a higher thermal conductivity than the material forming the outer layer which is formed from a second, different material. Source material is sublimation grown on the seed crystal in the growth crucible via the opening in the growth guide to thereby form a SiC crystal boule on the seed crystal.

The opening can have a cone-shape with a smaller diameter end and a larger diameter end. The seed crystal can be positioned at the smaller diameter end of the cone-shaped opening.

An angle between a central axis of the opening of the growth guide and an inner facing surface of at least the inner layer is either 43.3°, 48.6° or 54.7° for the growth of a 6H polytype SiC crystal boule, or 43.3° or 51.5° for the growth of a 4H polytype crystal boule.

At 2000° C., the inner layer can have a thermal conductivity greater than 50 W/(m·K) and the outer layer can have a thermal conductivity less than 20 W/(m·K).

The inner layer can be made from either isostatically molded graphite having less than 20 weight percent of binder or meso-phase graphite that contains no binder. The outer layer can be made from porous carbon.

The outer layer can act as a silicon getter during PVT growth of the SiC crystal boule.

The inner layer can be between 2 mm and 6 mm thick. The top of the growth crucible can be spaced from at least a part of the inner layer by a gap of between 2 mm and 5 mm. The gap can be filled with a material having a thermal conductivity less than 20 W/(m·K), such as, without limitation, the material that forms the outer layer.

At 2000° C., the inner layer desirably has a thermal conductivity greater than 80 W/(m·K) and the outer layer desirably has a thermal conductivity less than 10 W/(m·K).

The inner layer can be disposed in a slot or recess in the outer layer. The opening can be defined by the combination of a surface of the inner layer and a surface of the outer layer.

Also disclosed is a SiC crystal boule growth apparatus comprising a graphite growth crucible; SiC source material disposed at a bottom of an interior of the growth crucible; a SiC seed crystal disposed at a top of the interior of the growth crucible; a growth guide disposed at the top of the interior of the growth crucible, said growth guide having an opening that extends from the seed crystal toward the source material, said opening defined at least in part by a surface of a first layer of said growth guide that is supported in the growth crucible by a second layer of said growth guide, said first layer of said growth guide formed from a first material having a higher thermal conductivity than the material forming the second layer which is formed from a second, different material; and means for forming a temperature gradient in the growth crucible sufficient to cause the SiC source material to vaporize and be transported to the seed crystal where the vaporized source material condenses and forms a SiC crystal boule.

The opening can be cone-shaped with a smaller diameter end and a larger diameter end. The seed crystal can be positioned at the smaller diameter end of the cone-shaped opening. The larger diameter end of the cone-shaped opening can face the source material.

An angle between a central axis of the opening of the growth guide and the surface of the first layer is either 43.3°, 48.6° or 54.7° for the growth of a 6H polytype SiC crystal boule, or 43.3° or 51.5° for the growth of a 4H polytype crystal boule.

At 2000° C., the first layer can have a thermal conductivity greater than 50 W/(m·K) and the second layer can have a thermal conductivity less than 20 W/(m·K).

The first layer can be made from either isostatically molded graphite having less than 20 weight percent of binder or meso-phase graphite that contains no binder. The second layer can be made from porous carbon.

The opening can be defined by the combination of the surface of the first layer and a surface of the second layer.

The top of the growth crucible can be spaced from at least a part of the first layer by a gap.

BRIEF DESCRIPTION OF THE DRAWINGS

FIGS. 3A-3B are cross-sectional schematic views of prior art free expansion growths of SiC crystals on seed crystals that occur in PVT growth systems, like the PVT growth system shown in FIG. 1, in the presence of a high (or strong) radial temperature gradient and a low radial temperature gradient, respectively;

FIG. 3C is a cross-sectional schematic view of prior art guided expansion growth of a SiC crystal that occurs on a seed crystal in a PVT growth system, like the PVT growth system shown in FIG. 1;

FIG. 4A is a cross-sectional schematic view of an ideal prior art guided expansion growth of a SiC crystal that occurs on a seed crystal in a PVT growth system, like the PVT growth system shown in FIG. 1;

FIGS. 4B-4D are cross-sectional schematic views of prior art guided expansion growths of SiC crystals that occur on seed crystals in PVT growth systems, like the PVT growth system shown in FIG. 1, showing typical problems encountered with guided expansion growth, namely, erosion of the growth guide due to the aggressive silicon-rich vapor(s) produced during PVT growth, SiC deposits on the growth guide, and formation of polycrystalline SiC deposits on the growth guide, respectively;

DETAILED DESCRIPTION OF THE INVENTION

The SiC sublimation crystal growth disclosed herein utilizes guided expansion of the crystal diameter during the growth thereof to eliminate or avoid erosion of the growth guide, deposition of polycrystalline SiC on the guide and attachment of the crystal to the guide. It can be used for the production of large-diameter, high-quality SiC single crystals.

Figure 1:
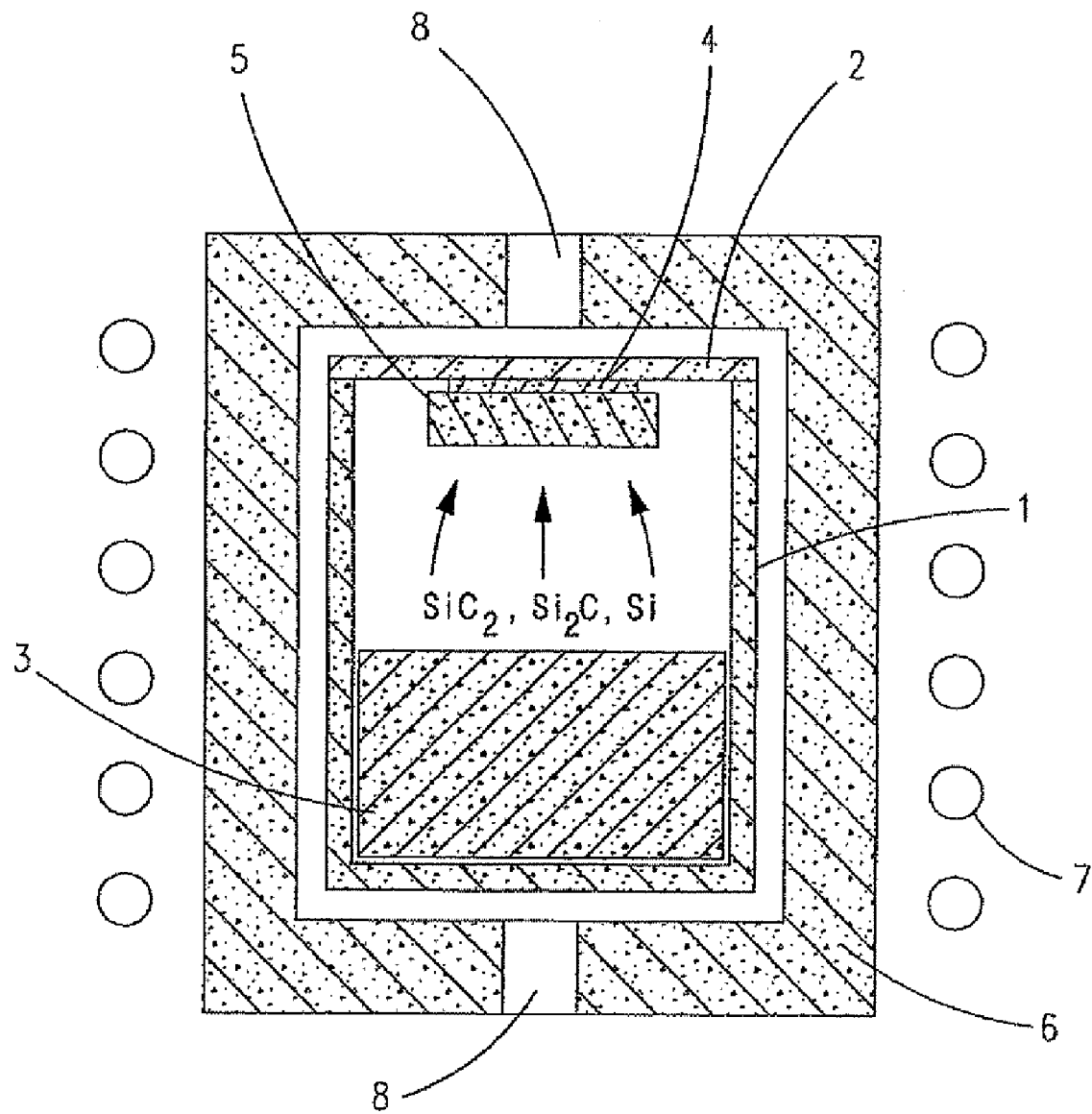
FIG. 1 is a cross-sectional schematic view of a prior art physical vapor transport (PVT) growth system for growing a SiC crystal on a seed crystal.
Figure 2:
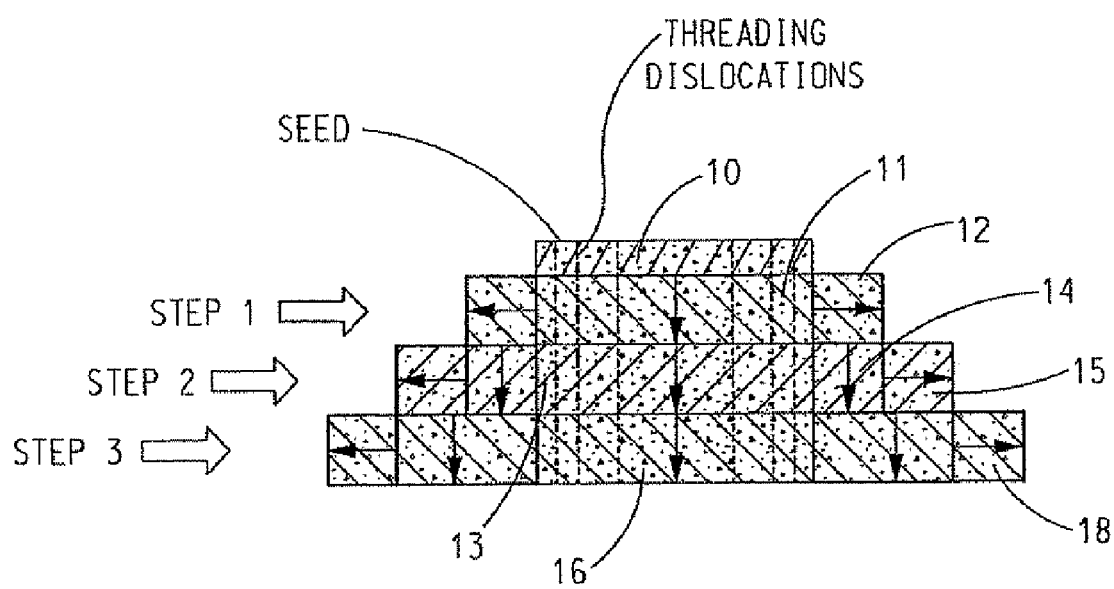
FIG. 2 is a diagrammatic view of a sequence of prior art lateral and normal growth of a growing SiC crystal on a seed crystal in a PVT growth system, like the PVT growth system shown in FIG. 1.
Figure 5A:
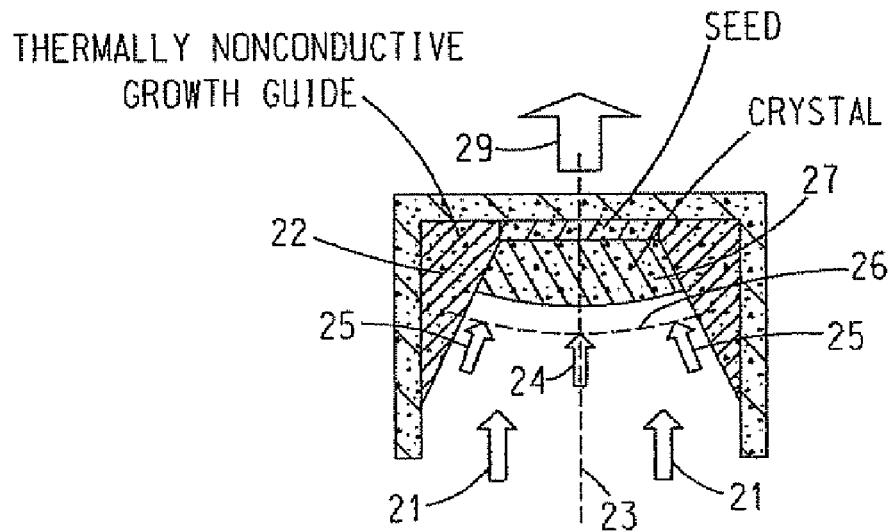
FIGS. 5A-5B are cross-sectional schematic views of prior art guided expansion growths of SiC crystals that occur on seed crystals in PVT growth systems, like the PVT growth system shown in FIG. 1, where the growth guide has zero thermal conductivity and the growth guide is thermally conductive, respectively.
Figure 5B:
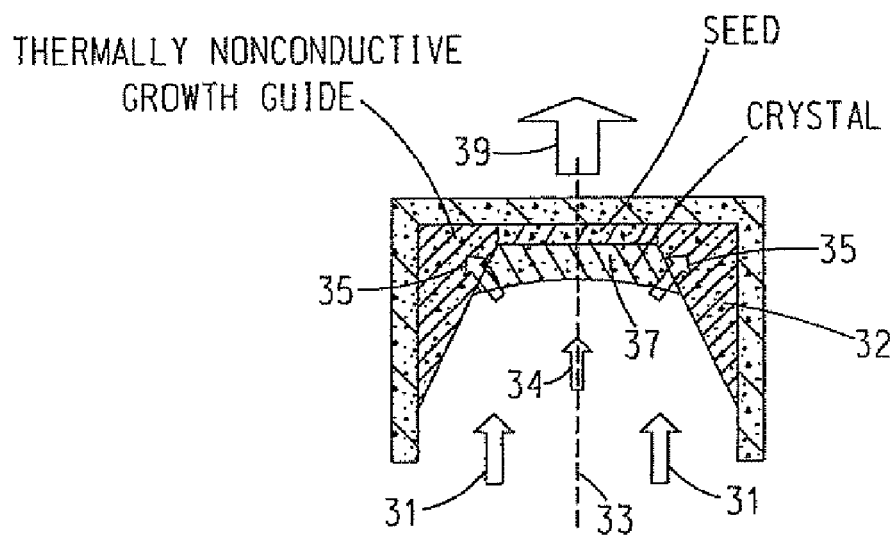
Figure 6:
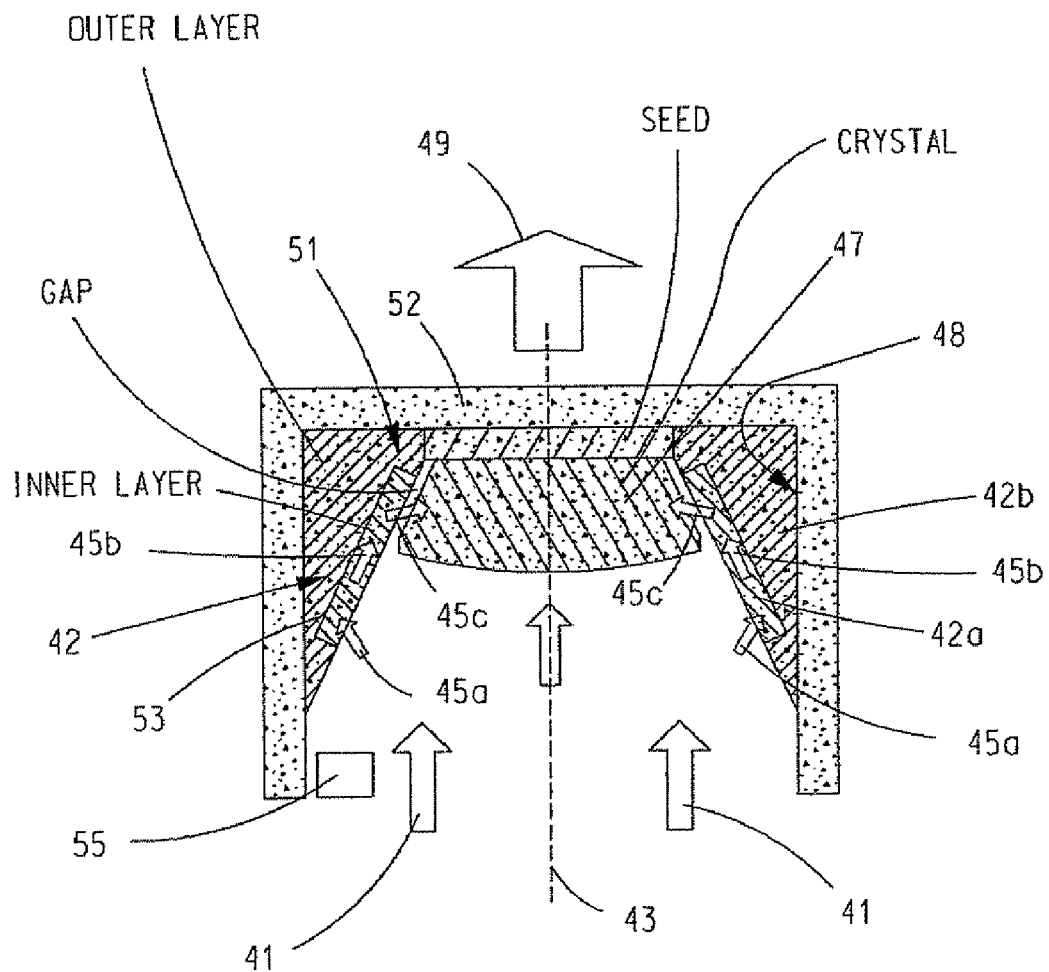
FIG. 6 is a cross-sectional schematic view of guided expansion growth of a SiC crystal on a seed crystal that occurs in a PVT growth system, like the PVT growth system shown in FIG. 1, utilizing a multi-layer growth guide of the type disclosed herein.

To understand the effect of the growth guide design on the temperature of its inner surface and its correlation with the crystal temperature, reference will now be made to FIGS. 5A, 5B and 6. FIGS. 5A, 5B and 6 each show schematically the upper part of a SiC crystal growth crucible, like crucible 1 in FIG. 1, with a thermally nonconductive conical growth guide, a thermally conductive conical growth guide and a multi-layer growth guide in accordance with an embodiment of the present invention, respectively. Each growth guide is disposed at the crucible top and surrounds the SiC seed crystal and the growing SiC crystal boule.

At high temperatures of SiC sublimation growth, the nature of heat transfer is mostly radiative with smaller contributions by heat conductance through graphite parts, such as the growth guide. Due to the fact that the source temperature is higher than the seed temperature, the general direction of the heat flow in the crucible is upward, from source to crystal, as shown schematically by arrows 21, 31 and 41 in FIGS. 5A, 5B and 6, respectively. Heat escaping the crucible is shown by arrows 29, 39 and 49. The growth interface of the SiC crystal generally has an isotherm configuration. However, the growth interface may slightly depart from the isotherm due to the formation of facets.

FIG. 5A depicts an ideal case of a prior art conical-shaped growth guide 22 having zero thermal conductivity. The conical shape of growth guide 22 acts as a heat "funnel", concentrating the heat flow toward a crucible axis 23 (shown in phantom). As a result, in addition to the axial heat flow inside the cavity of growth guide 22 denoted by arrow 24, heat flows with radial components emerge, as shown by arrows 25. This forms isotherms inside the cavity of growth guide 22 as well as the interface between the growing crystal 27 and the growth guide 22 that are convex toward the bottom of the crucible. A single convex isotherm 26 is shown in phantom in FIG. 5A. Due to the zero thermal conductivity of growth guide 22, no heat exchange takes place between growing crystal 27 and the conical inner surface of the growth guide 22. This implies that the temperatures of the surface of the growing crystal 27 and the conical inner surface of the growth guide 22 are the same in every point where they contact or come close enough to each other.

FIG. 5B illustrates a case where a conical growth guide 32 is made of a thermally conductive material, such as conventional isostatically molded graphite. Heat conductance across growth guide 32 leads to the emergence of heat flows with radial components directed outward, as shown by arrows 35, in addition to axial heat flow inside the guide cavity, denoted by arrow 34, parallel to a crucible axis 33 (shown in phantom). Heat exchange takes place between crystal 37 during growth thereof and the conical inner surface of growth guide 32, with heat transport directed from crystal 37 into growth guide 32. Thus, the temperature of the inner surface of growth guide 32 is lower than that of crystal 37. Accordingly, deposition of polycrystalline SiC on growth guide 32 and merger between the growing crystal 37 boule and growth guide 32 are likely.

With reference to FIG. 6, a conical growth guide 42 in accordance with an embodiment of the present invention is comprised of two separate layers that are joined together to form growth guide 42. The two layers include an outer layer 42b which faces an interior wall 48 of the crucible and an inner layer 42a which faces growing crystal 47. Outer layer 42b is fabricated from a material with low thermal conductivity, such as, without limitation, porous carbon, while inner layer 42a is made from a material with high thermal conductivity, such as, without limitation, graphite. A gap 51 is provided between inner layer 42a and the top or lid 52 of the crucible. Gap 51 is filled with the low thermal conductivity material of outer layer 42b, as shown in FIG. 6, or any other suitable and/or desirable thermally nonconductive material.

Heat conductance along inner layer 42a of growth guide 42 is shown by arrows 45a, 45b and 45c. Due to this heat conductance, radial heat flows emerge in the cavity of the growth guide 42. In the lower portion of growth guide 42, radial heat flows are directed outward as shown by arrows 45a. In the upper portion of growth guide 42, where the SiC crystal 47 is growing, radial heat flows are directed inward as shown by arrows 45c, that is, in the direction from growth guide 42 to crystal 47. This means that the temperature of the inner surface of growth guide 42 is higher than that of the crystal 47. Accordingly, deposition of polycrystalline SiC on growth guide 42 in the vicinity of crystal 47 and merger between the growing crystal 47 boule and growth guide 42, especially inner layer 42a, are unlikely.

Desirably, the material used for outer layer 42b of growth guide 42 is a porous carbon material with low thermal conductivity at SiC sublimation growth temperatures. Desirably, the thermal conductivity of outer layer 42b of growth guide 42 is below 20 W/(m·K) at 2000° C. and, more desirably, below 10 W/(m·K).

Desirably, the material used for inner layer 42a of growth guide 42 is isostatically molded graphite with high thermal conductivity at SiC sublimation growth temperatures. Desirably, the thermal conductivity of inner layer 42a of growth guide 42 is above 50 W/(m·K) at 2000° C. and, more desirably, above 80 W/(m·K).

Inner layer 42a of growth guide 42 is shaped as a thin-walled cone with a wall thickness desirably between 2 and 6 mm. Gap 51 between inner layer 42a of growth guide 42 and crucible lid 52 is desirably between 2 and 5 mm wide and filled with a low thermal conductivity material, such as, without limitation, the material used to form outer layer 42b of growth guide 42.

Desirably, inner layer 42a is disposed in a slot or recess 53 formed in outer layer 42b, whereupon the surfaces of inner and outer layers 42a and 42b that face a crucible axis 43 (shown in phantom) are coplanar or substantially coplanar and together define the conical inner surface of growth guide 42.

The stability of graphite against gas or vapor erosion during PVT growth depends on the content of the binder: the higher the binder content, the more susceptible the graphite is to erosion. In the embodiment shown in FIG. 6 and described above in connection therewith, the resistance of growth guide 42 against attack by Si-rich vapor is improved by fabricating inner layer 42a desirably from dense, isostatically-molded graphite with low binder content. Desirably, the graphite grade used for the fabrication of inner layer 42a of growth guide 42 contains less than 20 weight percent of binder. More desirably, inner layer 42a of the growth guide 42 is made of meso-phase graphite which contains no binder.

Due to the incongruent character of SiC sublimation, the vapor phase over SiC is silicon-rich. Depending on temperature, the Si:C atomic ratio in the vapor can be between 1.3 and 3 in the temperature range of SiC sublimation growth. The Si:C ratio may also depend on the SiC grain size and polytypic composition of the source. That is, the Si:C ratio is higher in the vapor phase over finely divided SiC grain than over larger-size grain. It is also higher over non-hexagonal polytypes, than over hexagonal polytypes. It has been observed that the higher the Si:C ratio in the vapor phase during SiC sublimation growth, the stronger the graphite erosion.

In order to decrease the aggressiveness of the Si-rich vapor toward graphite, excessive silicon is desirably removed from the vapor phase. This can be achieved by including a silicon "getter" 55 inside the growth crucible. Silicon getter 55 (shown for illustration purposes only as a block in FIG. 6) is desirably made from a carbon material with high chemical affinity for silicon and, more desirably, from porous or fibrous graphite, porous or fibrous carbon or carbonized organic foams or felts.

Grown crystals often exhibit a high degree of stress caused by certain conditions during growth. These conditions may include, without limitation, temperature gradients, doping levels, compositional or doping non-uniformities, specific growth mechanisms and conditions. It is also known that a too high degree of growth-related stress can cause cracking upon subsequent fabrication of a grown crystal boule into wafers.

Stress and subsequent cracking in a grown crystal can be reduced by reducing the number and variety of edge facets formed at the edge of the crystal during growth. In order to achieve this, conical growth guide 42 is made with a cone angle, i.e., the angle between the central axis 43 of growth guide 42 and the inner surface of growth guide 42 (e.g., without limitation, the inner surface of inner layer 42a), corresponding to the angle formed between one of the dominant pyramidal facets in hexagonal SiC and the c-axis in hexagonal SiC. The dominant pyramidal crystal facet is desirably selected from the group consisting of the $\{1, 0, -1, n\}$ facets, where n=4, 5 and 6 for the 6H polytype and n=3 and 4 for the 4H polytype. For 6H polytype, the corresponding cone angle of growth guide 42 is selected from the values of 43.3°, 48.6° and 54.8°. For 4H polytype, the corresponding cone angle of growth guide 42 is selected from the values of 43.3° and 51.5°.

In addition, more conventional measures, such as post-growth annealing, can also be applied to grown crystal boules and/or to the sliced wafers in order to reduce stress and cracking.

In summary, the above-described embodiment has the following features:

1. SiC sublimation growth process combined with guided expansion of the boule diameter is carried out using a conical growth guide positioned around the growing boule and coaxially with it. The growth guide is comprised of two layers: an inner layer having high thermal conductivity and an outer layer having low thermal conductivity.

2. The inner layer of the growth guide is desirably made of a thermally conductive graphite, such as, without limitation, isostatically-molded graphite. Desirably, the inner layer of the growth guide has thermal conductivity higher than 50 W/(m·K) at 2000° C. and, more desirably, higher than 80 W/(m·K).

3. The outer layer of the growth guide is desirably made of a carbon material with low thermal conductivity. Desirably, the outer layer of the growth guide has thermal conductivity below 20 W/(m·K) at 2000° C. and, more desirably, below 10 W/(m·K).

4. The inner layer of the growth guide is desirably 2 to 6 mm thick.

5. Desirably, a gap exists between an upper part (or end) of the inner layer of the growth guide and the crucible lid. Desirably, this gap is between 2 and 5 mm wide. The gap is filled with a material having low thermal conductivity, such as, without limitation, the material used for the outer layer of the guide.

6. The inner layer of the growth guide is desirably made of graphite grade containing, desirably less than 20 weight percent of binder. More desirably, the inner layer of the guide is made of meso-phase graphite which contains no binder.

7. SiC sublimation growth is desirably carried out with a reduced silicon-to-carbon ratio in the vapor phase achieved by the removal of excessive silicon from the vapor phase.

8. In-situ removal of excessive silicon from the vapor phase is desirably accomplished using a silicon getter disposed inside the growth crucible. Desirably the silicon getter is a porous carbon material with high chemical affinity for silicon. More desirably, the silicon getter is porous or fibrous graphite, or porous or fibrous carbon in the form of carbonized organic foam or felt.

9. The conical growth guide has a cone angle (the angle between the cone surface and the cone axis) that is desirably selected from angles formed by the pyramidal facets in the 6H or 4H crystal polytypes with the hexagonal c-axis. More specifically, the crystal facets are desirably selected from the group consisting of the $\{1, 0, -1, n\}$ facets, where n=4, 5 and 6 for the 6H polytype and n=3 and 4 for the 4H polytype. More desirably, the cone angle of the growth guide is selected from the values of 43.3°, 48.6° and 54.7° for the 6H polytype and from the values of 43.3° and 51.5° for the 4H polytype.

The SiC crystal growth process combined with the guided diameter expansion described above has the following advantages:

1. Defect-free lateral expansion of the SiC bottle diameter. It is envisioned that this advantage will enable the SiC substrate diameter to be scaled from the current 76.2 mm (3 inches) to 100 mm in the near future and to 125-150 mm in the more distant future.

2. Improved crystal quality of SiC substrates, including reduced density of defects at the edge of the substrate, such as grains, micropipes and dislocations.

A number of SiC single crystals of 6H and 4H polytypes have been grown using the technique of guided diameter expansion described above. One such crystal growth will be described next.

Sublimation crystal growth was carried out in a crucible made of dense, isostatically molded graphite. A 60 mm diameter 6H—SiC seed was prepared with its faces cut parallel to the crystallographic (0001) plane. The seed was bonded to the seed-holder (in this example, the crucible top or lid) using a carbon-based adhesive. The SiC source material was a high-purity polycrystalline SiC grain, 1 to 3 mm in size. The SiC source material was loaded in the bottom of the crucible.

A growth guide, like growth guide 42 described above, with a conical inner surface and a cone angle of 44° was prepared. The growth guide included two layers, as shown in FIG. 6. A thin-walled cone with the wall thickness of 3 mm was machined from isostatically-molded graphite with the density of 1.78 g/cm$^3$ and containing less than 20 weight percent binder. This cone was used as the growth guide's inner layer. According to the data from the manufacturer, this isostatically-molded graphite had a thermal conductivity of about 130 W/(m·K) at room temperature and about 80 W/(m·K) at 2000° C. A 2 mm gap was formed between the inner layer of the guide and the crucible lid. This gap was filled with the material used for the outer layer of the guide.

The outer layer of the guide was made of porous graphite with the density close to 1.0 g/cm$^3$. The thermal conductivity of this material was about 60 W/(m·K) at room temperature and below 20 W/(m·K) at 2000° C. This material also served as a silicon getter.

The growth run was carried out according to standard SiC growth procedures. The crucible loaded with the source and the seed, and the growth guide was placed inside the crucible. The crucible was surrounded by thermal insulation made of lightweight graphite foam. Heating was provided by an RF coil positioned coaxially with respect to the crucible.

In preparation for growth, the growth crucible was evacuated and flushed with an inert gas, such as, without limitation, pure helium, to remove oxygen, nitrogen and moisture. Then, the crucible was heated to the desired growth temperatures under helium pressure of 500 Torr. Upon reaching the growth temperatures, the helium pressure inside the growth crucible was lowered from 500 Torr to 20 Torr. In the process of heating, the RF coil position was adjusted to achieve the temperature at the crucible bottom (source) of 2130° C., and 2090° C. at the crucible top (seed). Optical pyrometers were used to measure the temperatures at the top and bottom of the crucible. During growth, these temperatures were maintained constant.

Upon completion of the growth cycle, the crucible was cooled to room temperature. The crucible lid carrying the grown crystal boule surrounded by the growth guide was recovered. Visual inspection revealed a gap of about 1 mm between the grown crystal boule and the growth guide. Only minor traces of erosion were detected on the inner surface of the growth guide. The growth guide was separated from the crystal and analyzed. While the inner layer of the growth guide showed some small weight loss due to vapor erosion, the outer layer of the growth guide showed a weight gain due to the absorption of silicon from the vapor phase.

Figure 7:
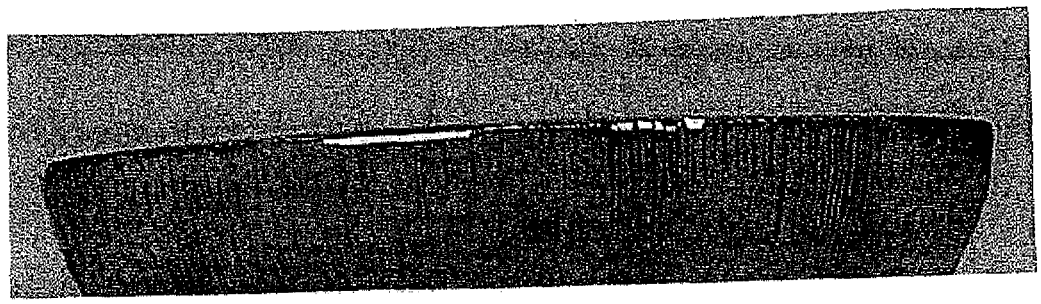
FIG. 7 is a photograph of a side of a 6H—SiC crystal boule grown in a PVT growth system, like the PVT growth system shown in FIG. 1, utilizing the multi-layer growth guide of the type shown in FIG. 6.

A photograph of an as-grown 6H—SiC crystal boule is shown in FIG. 7. During growth, the crystal boule expanded from 60 mm to about 85 mm in diameter. The crystal boule had a smooth and shiny growth interface, was flat in the center and was slightly convex at the edges. No visible defects were present on the crystal boule surface.

Prior to fabricating into wafers, the as-grown crystal boule was subjected to post-growth annealing. The annealing was isothermal, that is, the crystal boule was situated inside a graphite enclosure designed to minimize temperature gradients therein. Annealing conditions included a suitable combination of temperature, pressure and duration know in the art.

Figure 8A:
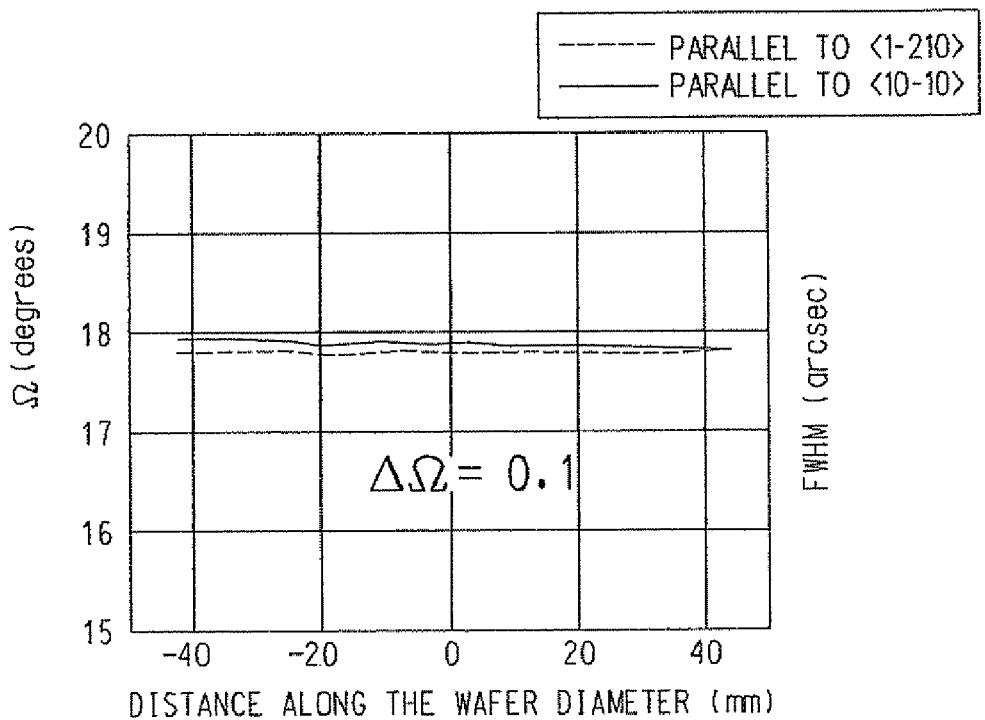
FIGS. 8A-8B are diagrams of linear rocking curve scans on a wafer obtained from the crystal boule shown in FIG. 7 showing sample angle $\Omega$ (degrees) versus distance along the wafer and full width half maximum (FWHM) versus distance along the wafer, respectively.
Figure 8B:
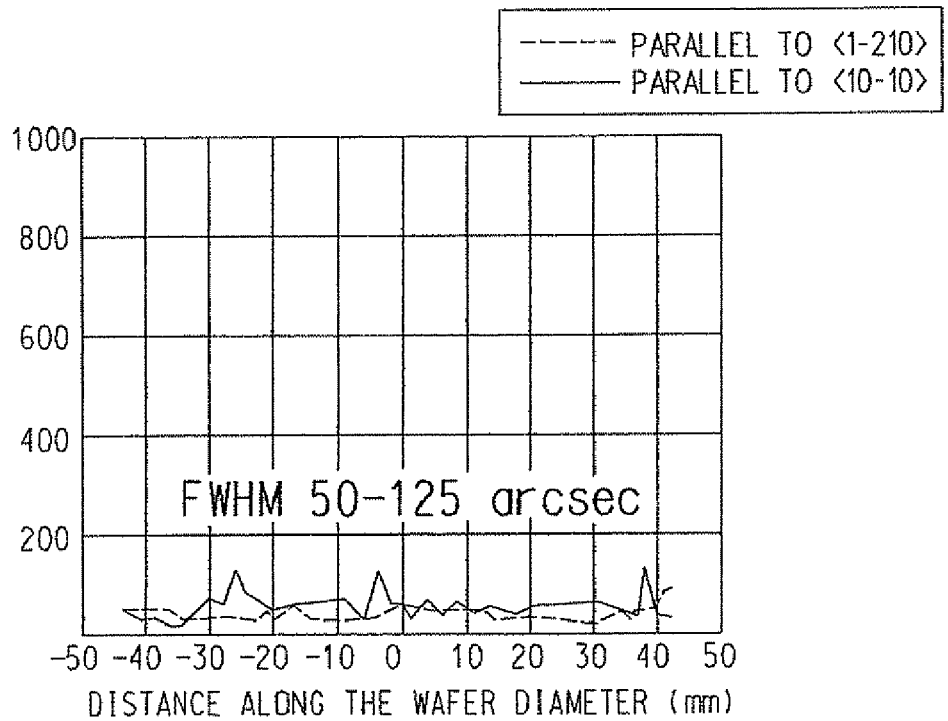

The grown crystal boule was fabricated into wafers. The prepared wafers were characterized using the technique of x-ray rocking curves. X-ray measurements were carried out using a double crystal diffractometer (CuKα1, spot size of 1×1 mm$^2$, (0006) Bragg reflection). FIGS. 8A and 8B show the result of a linear rocking curve scan performed on one of the wafers. The Ω scan of FIG. 8A, shows that variations in the sample angle Ω across the wafer diameter are small, about 0.1°. This indicates that the crystal has no misoriented sub-grains. The FWHM scan of FIG. 8B shows that the width (FWHM) of the rocking curves is below 125 arc-seconds and below 50 arc-seconds at the edges. The shape of the rocking curve is an excellent measure of the crystal quality: the higher the crystal quality, the stronger the reflection and the smaller its FWHM. The results shown in FIGS. 7, 8A and 8B are typical for all SiC crystals grown in the manner described herein utilizing the multi-layer growth grid of FIG. 6.

Figure 9A:
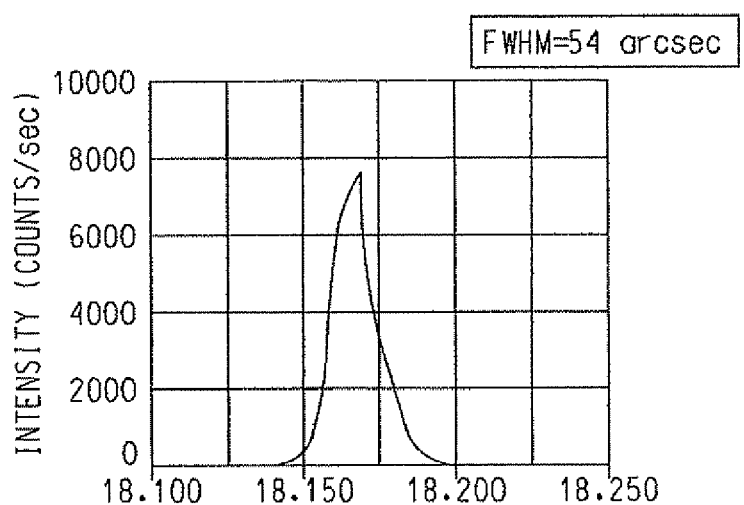
FIGS. 9A-9C are diagrams of x-ray reflections at one edge, the center and the outer edge of the crystal boule shown in FIG. 7.
Figure 9B:
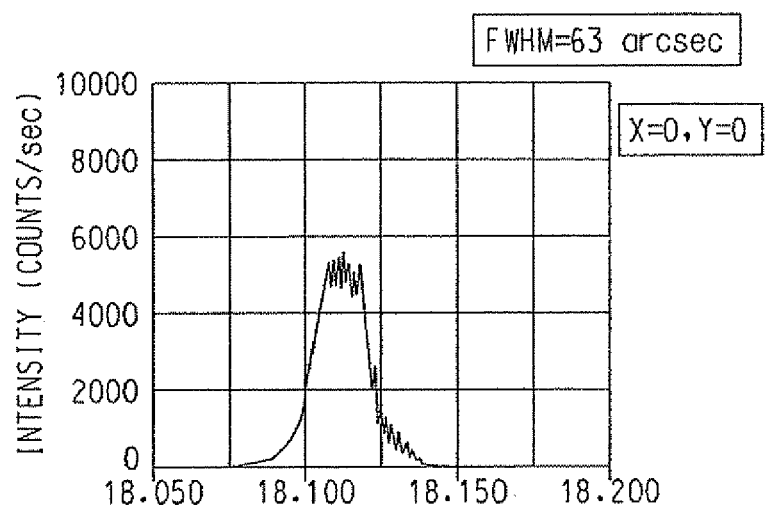
Figure 9C:
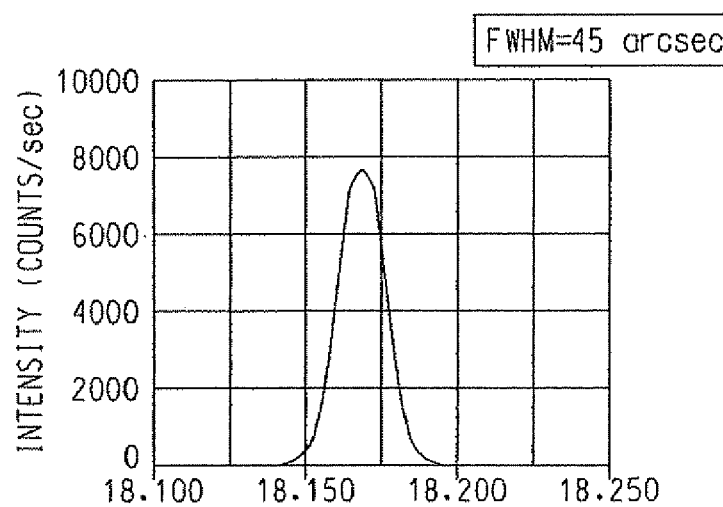

FIGS. 9A-9C show x-ray reflections at one edge of the grown boule, at the center of the grown boule and at an opposite edge of the grown boule, respectively. As can be seen, x-ray reflections measured at the edges of the grown boule are stronger and narrower than x-ray reflections measured at the central region.

Figure 10A:
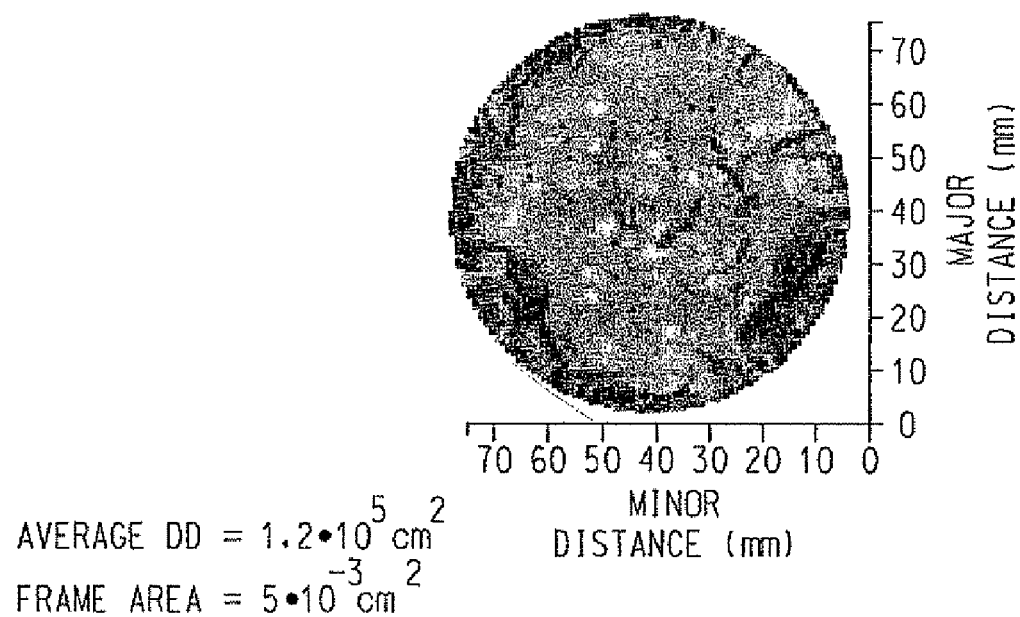
FIGS. 10A-10B are dislocation density maps obtained from a SiC wafer grown without the growth guide of FIG. 6 and a SiC wafer grown using the growth guide of FIG. 6, respectively, wherein darker shades indicate more dislocation densities and lighter shades indicate less dislocation densities.
Figure 10B:
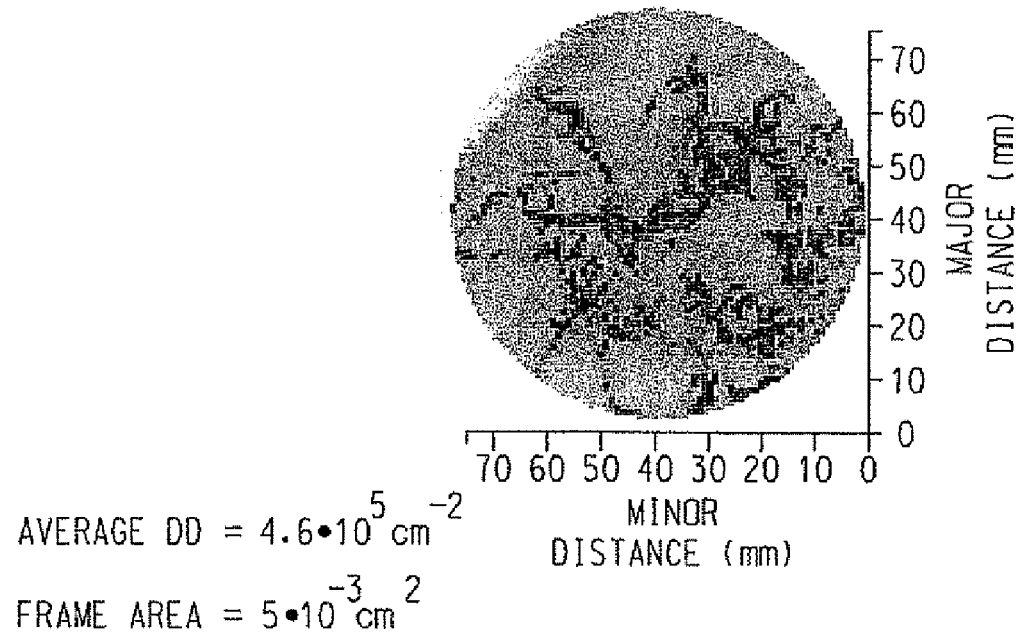

FIGS. 10A and 10B illustrate the effect of guided diameter expansion on dislocation density. FIG. 10A is a dislocation density map measured on a standard production-grade 76.2 mm (3 inch) diameter semi-insulating 6H—SiC wafer sliced from a boule grown using a standard PVT growth process, i.e., without guided diameter expansion. The map shows the average dislocation density of $1.2 \cdot 10^5$ cm$^{-2}$. Areas of high dislocation density reaching $10^6$ cm$^{-2}$ are visible as dark "clouds" near the wafer edge.

FIG. 10B shows a dislocation density map of a 76.2 mm (3 inch) wafer sliced from a boule grown using guided diameter expansion described above utilizing the multi-layer growth grid of FIG. 6. The average dislocation density in this wafer is $4.6 \cdot 10^4$ cm$^{-2}$. As can be seen, the dislocation density near the edges is lower than in the central areas.

The results obtained on SiC boules grown using the technique of guided diameter expansion described herein utilizing the multi-layer growth grid of FIG. 6 indicate high crystal quality of the "expanded" portions of the crystals. This makes the described SiC sublimation growth process useful for the production of large and high quality SiC single crystals.

As can be seen, the SiC sublimation crystal growth described herein utilizing the multi-layer growth grid of FIG. 6 combines axial growth with lateral growth of the boule diameter, in which the degree of lateral growth and the shape of the growing crystal are determined by a conical guide positioned around the growing boule and co-axially with it.

The SiC sublimation crystal growth described herein utilizing the multi-layer growth grid of FIG. 6 avoids or eliminates the shortcomings of guided diameter expansion growth of the prior art, namely, erosion of the growth guide by the vapor, deposition of polycrystalline SiC on the inner surface of the guide and attachment of the growing crystal to the guide.

The invention has been described with reference to the preferred embodiment. Obvious modifications and alterations will occur to those skilled in the art upon reading and understating the preceding detailed description. It is intended that the invention be construed as including all such modifications and alterations insofar as they come within the scope of the appended claims or the equivalents thereof.

The invention claimed is:

1. A SiC crystal boule growth method comprising:
   (a) providing a growth guide inside of a growth crucible that is charged with SiC source material at a bottom of the crucible and a SiC seed crystal at a top of the crucible, said growth guide having an inner layer that defines at least part of an opening in the growth guide and an outer layer supporting the inner layer in the crucible, said opening facing the source material with the seed crystal positioned at an end of the opening opposite the source material, wherein the inner layer is formed from a first material having a higher thermal conductivity than the material forming the outer layer which is formed from a second, different material; and
   (b) sublimation growing source material on the seed crystal in the growth crucible via the opening in the growth guide to thereby form a SiC crystal boule on the seed crystal, wherein:
   the inner layer is made from either isostatically molded graphite having less than 20 weight percent of binder or meso-phase graphite that contains no binder; and
   the outer layer is made from porous carbon.

2. The method of claim 1, wherein:
   the opening has a cone-shape with a smaller diameter end and a larger diameter end; and
   the seed crystal is positioned at the smaller diameter end of the cone-shaped opening.

3. The method of claim 2, wherein an angle between a central axis of the opening of the growth guide and an inner facing surface of at least the inner layer is either 43.3°, 48.6° or 54.7° for the growth of a 6H polytype SiC crystal boule, or 43.3° or 51.5° for the growth of a 4H polytype crystal boule.

4. The method of claim 1, wherein, at 2000° C.:
   the inner layer has a thermal conductivity greater than 50 W/(m·K); and
   the outer layer has a thermal conductivity less than 20 W/(m·K).

5. The method of claim 1, wherein, at 2000° C.:
   the inner layer has a thermal conductivity greater than 80 W/(m·K); and
   the outer layer has a thermal conductivity less than 10 W/(m·K).

6. The method of claim 1, wherein the outer layer acts a silicon getter during PVT growth of the SiC crystal boule.

7. The method of claim 1, wherein the inner layer is between 2 mm and 6 mm thick.

8. The method of claim 1, wherein the top of the growth crucible and the inner layer are spaced no closer than 2-5 mm.

9. The method of claim 8, wherein the space is filled with a material having a thermal conductivity less than 20 W/(m·K).

10. The method of claim 8, wherein the space is filled with the material that forms the outer layer.

11. The method of claim 1, wherein the inner layer is disposed in a slot or recess in the outer layer.

12. The method of claim 11, wherein the opening in the growth guide is defined by the combination of a surface of the inner layer being exposed to the chamber and at least a part of a surface of the outer layer being exposed to the chamber.

* * * * *